(12) United States Patent
Chen et al.

(10) Patent No.: US 9,791,898 B2
(45) Date of Patent: Oct. 17, 2017

(54) USB DATA CARD

(71) Applicant: ZTE Corporation, Shenzhen (CN)

(72) Inventors: Yanxin Chen, Shenzhen (CN); Xiaoliang Zhang, Shenzhen (CN)

(73) Assignee: XI'AN ZHONGXING NEW SOFTWARE CO., LTD, Xi'An (CN)

( * ) Notice: Subject to any disclaimer, the term of this patent is extended or adjusted under 35 U.S.C. 154(b) by 12 days.

(21) Appl. No.: 14/441,095

(22) PCT Filed: Aug. 13, 2013

(86) PCT No.: PCT/CN2013/081385
§ 371 (c)(1),
(2) Date: May 6, 2015

(87) PCT Pub. No.: WO2014/071759
PCT Pub. Date: May 15, 2014

(65) Prior Publication Data
US 2015/0293565 A1  Oct. 15, 2015

(30) Foreign Application Priority Data
Nov. 6, 2012  (CN) .................... 2012 2 0580098 U

(51) Int. Cl.
*H05K 5/02*  (2006.01)
*G06F 1/18*  (2006.01)

(52) U.S. Cl.
CPC ........... *G06F 1/181* (2013.01); *H05K 5/0278* (2013.01)

(58) Field of Classification Search
CPC . G06F 17/30312; G06F 1/181; H05K 5/0278; H05K 5/0286; H05K 7/1401

USPC ..................................... 361/679.31
See application file for complete search history.

(56) References Cited

U.S. PATENT DOCUMENTS

| 6,743,030 B2* | 6/2004 | Lin | ....... | H01R 31/065 |
| | | | | 439/131 |
| 8,152,557 B2* | 4/2012 | Blanton | ............ | H01R 13/6215 |
| | | | | 439/362 |
| 2003/0103369 A1* | 6/2003 | Wu | ....... | G06K 19/077 |
| | | | | 365/131 |

(Continued)

FOREIGN PATENT DOCUMENTS

CN  201294103 Y  8/2009
CN  201294105 Y  8/2009

(Continued)

OTHER PUBLICATIONS

International Search Report issued Nov. 21, 2013 re: Application No. PCT/CN2013/081385; citing: CN 201294103 Y, CN 102275417 A, CN 201893120 U, CN 201294105 Y and CN 202979506 U.

(Continued)

*Primary Examiner* — Anthony Haughton
*Assistant Examiner* — Ingrid Wright
(74) *Attorney, Agent, or Firm* — Cantor Colburn LLP

(57) ABSTRACT

A USB data card includes a main body and a USB protection cover which is used for protecting a USB plug. The main body is provided with a decorative part which is detachably connected with the USB protection cover. The utility model can prevent the USB protection cover from loss, so that the time for the USB protection cover to protect the USB plug is prolonged, and then the service life of the USB data card is prolonged.

8 Claims, 1 Drawing Sheet

(56) References Cited

U.S. PATENT DOCUMENTS

| | | | |
|---|---|---|---|
| 2005/0079738 A1 | 4/2005 | Ahn | |
| 2008/0198562 A1* | 8/2008 | Lin | A45C 11/24 |
| | | | 361/757 |
| 2008/0237237 A1 | 10/2008 | Watson | |
| 2009/0147461 A1 | 6/2009 | Tsai | |
| 2010/0073855 A1* | 3/2010 | Liang | G06F 3/0219 |
| | | | 361/679.08 |
| 2010/0264047 A1* | 10/2010 | Kelley | H05K 5/0278 |
| | | | 206/232 |
| 2012/0087079 A1* | 4/2012 | Ting | H05K 5/0278 |
| | | | 361/679.32 |
| 2012/0118014 A1* | 5/2012 | King | A44C 25/001 |
| | | | 63/1.13 |
| 2012/0154991 A1* | 6/2012 | Lei | H04M 1/0262 |
| | | | 361/679.01 |
| 2013/0255039 A1* | 10/2013 | Sedivy | A45F 5/02 |
| | | | 24/304 |

FOREIGN PATENT DOCUMENTS

| | | |
|---|---|---|
| CN | 201893120 U | 7/2011 |
| CN | 102275417 A | 12/2011 |
| CN | 202979506 U | 6/2013 |

OTHER PUBLICATIONS

Written Opinion issued Nov. 21, 2013 re: Application No. PCT/CN2013/081385; citing: CN 201294103 Y, CN 102275417 A.
Extended European Search Report issued Nov. 20, 2015 re: Application No. PCT/CN2013/081385; pp. 1-7; citing: US 2005/079738 A1 , US 2009/147461 A1 and US 2008/237237 A1.

\* cited by examiner

USB DATA CARD

TECHNICAL FIELD

The disclosure relates to the technical field of USB devices, including e.g., a Universal Serial Bus (USB) data card.

BACKGROUND

Now a data card with a USB protection cover is sold in the market, and the USB protection cover is usually in buckle connection with a main body. During the usage by a user, the USB protection cover and the main body are independently separated, thereby causing the USB protection cover to be easily lost and not facilitating the usage by the user.

SUMMARY

A USB data card is provided in the embodiment of the disclosure, which is intended to prevent the loss of the USB protection cover.

According to an aspect of the utility model, a Universal Serial Bus, USB, data card is provided, comprising a main body and a USB protection cover which is configured to protect a USB plug, wherein the main body is provided with a decorative part which is detachably connected with the USB protection cover.

According to an example embodiment of the utility model, the decorative part is provided with a sling, and the main body is provided with a through hole for the sling to pass, wherein the sling and the through hole together connect the decorative part with the main body.

According to an example embodiment of the utility model, the USB protection cover is in buckle connection with the main body.

According to an example embodiment of the utility model, an inside wall of the USB protection cover is provided with one or more raised lines, and one end of the main body which is near the USB plug is provided with one or more first grooves adapted to the one ore more raised lines, wherein the one or more raised lines and the one or more first grooves together fix the USB protection cover on the main body in a clamping manner.

According to an example embodiment of the utility model, the USB protection cover is in buckle connection with the decorative part.

According to an example embodiment of the utility model, a inside wall of the USB protection cover is provided with one or more raised lines, and the decorative part is provided with one or more second grooves adapted to the one or more raised lines, wherein the one or more raised lines and the one or more second grooves together fix the USB protection cover on the decorative part in a clamping manner.

According to an example embodiment of the utility model, the decorative part comprises an inserting combination portion inserted into the USB protection cover, and the size of the inserting combination portion is consistent with the size of the USB plug.

According to an example embodiment of the utility model, the USB protection cover is in interference fit connection with the decorative part.

According to an example embodiment of the utility model, the USB protection cover is in threaded connection with the decorative part By providing the decorative part which can be detachably connected with the USB protection cover, and fixing the USB protection cover on the decorative part during the usage of the USB data card, the USB protection cover can be prevented from loss in the embodiment of the utility model, so that the time for the USB protection cover to protect the USB plug is prolonged, and then the service life of the USB data card is prolonged.

Implementation of objects, functional features and advantages of embodiments of the disclosure will be further described in detail in combination with embodiments and with reference to accompanying drawings.

DESCRIPTION OF EMBODIMENTS

It is understood that the specific example described herein is only intended to explain the disclosure, and is not taken to limit the disclosure.

Figure 1:
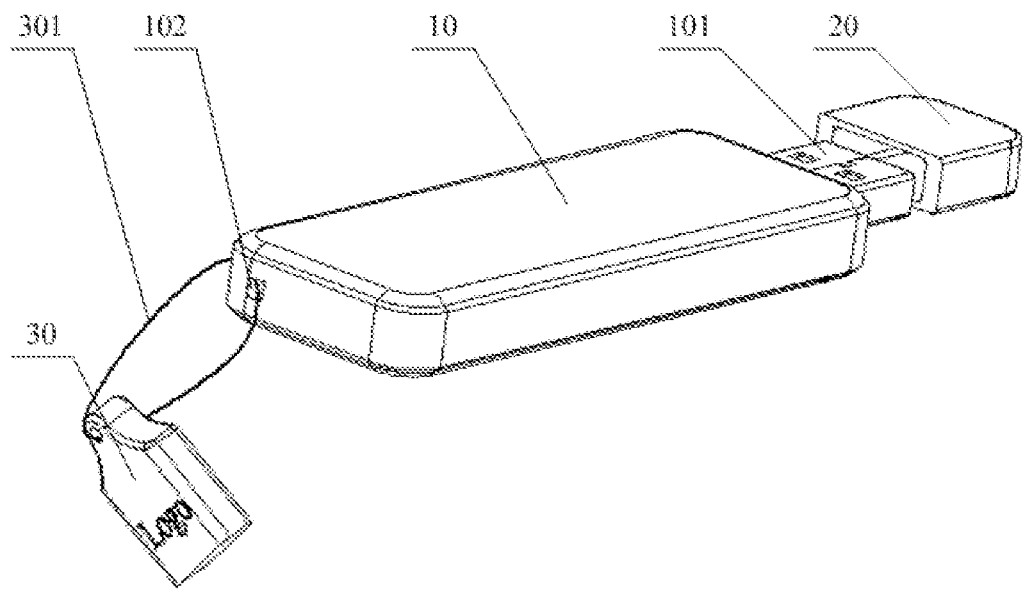
FIG. 1 is a state structural schematic diagram of a USB data card in an example embodiment of the utility model.
Figure 2:
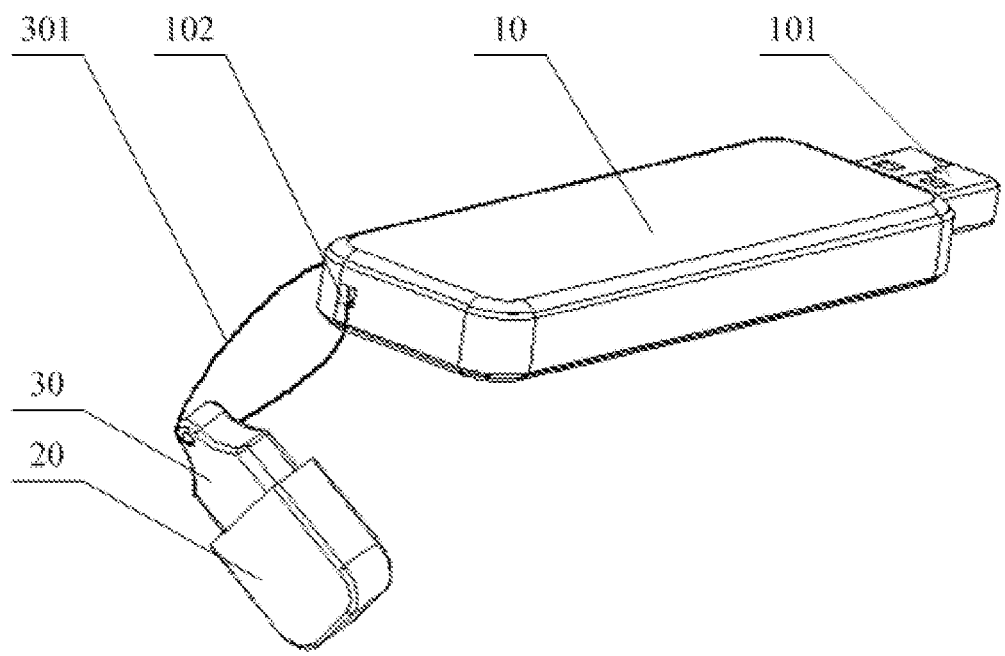
FIG. 2 is another state structural schematic diagram of a USB data card in an example embodiment of the utility model.

With reference to FIG. 1 and FIG. 2, FIG. 1 is a state structural schematic diagram of a USB data cark in an example embodiment of the utility model; and FIG. 2 is another state structural schematic diagram of a USB data cark in an example embodiment of the utility model USB data card. The USB data card provided in the present embodiment comprises a main body 10 and a USB protection cover 20 which is configured to protect a USB plug 101, wherein the main body 10 is provided with a decorative part 30 which is detachably connected with the USB protection cover 20.

In the present embodiment, the above decorative part 30 is provided with a sling 301, and the main body is provided with a through hole 102 for the sling 301 to pass, wherein the sling 301 and the through hole 102 together connect the decorative part 30 with the main body 10; and the above USB protection cover 20 is in buckle connection with the main body 10.

When the USB data card is not used, the USB protection cover 20 may be connected to the main body 10 in a clamp-fixing manner so as to protect the USB plug 101; when the USB card is used, the USB protection cover 20 may be detached from the main body 10 and assembled together with the decorative part 30.

The decorative part 30 which can be detachably connected with the USB protection cover 20 is provided in the utility model. When the USB protection cover 20 is fixed on the decorative part 30 during the usage of the USB data card, the USB protection cover 20 can be prevent from loss, so that the time for the USB protection cover 20 to protect the USB plug 101 is prolonged, and then the service life of the USB data card is prolonged.

It should be noted that in the present embodiment, the decorative part 30 is connected to the main body 10 through the sling 301. The decorative part 30 further may be served as a decoration of other products according to the preferences of the users, for example, the decorative part 30 may be connected to a mobile phone through the sling 301, thereby enhancing the applicability of the decorative part 30.

According to an example embodiment of the utility model, the USB protection cover 20 is in buckle connection with the main body 10. For example, the inside wall of the USB protection cover 20 is provided with one or more raised lines, and one end of the main body 10 which is near the USB plug 101 is provided with one or more first grooves adapted to the one or more raised lines, wherein the one or more raised lines and the one or more first grooves together fix the USB protection cover 20 on the main body 10 in a clamping manner. It should be noted that in the present embodiment, the one or more grooves are provided on the main body 10, and the one or more raised lines are provided on the USB protection cover 20; and in other embodiments, the one or more grooves further may be provided on the USB protection cover 20, and the one or more raised lines adapted to the one or more grooves are provided on the main body 10.

The connection between the USB protection cover 20 and the decorative part 30 may be set according to practical requirements, which will be described in detail below.

The USB protection cover 20 is in buckle connection with the decorative part 30. Based on the above embodiments, the inside wall of the USB protection cover 20 is provided with one or more raised lines. In the present embodiment, the decorative part 30 is provided with second one or more grooves adapted to the one or more raised lines, and the one or more raised lines and the one or more second groove together fix the USB protection cover on the decorative part 30 in a clamping manner. It should be understood that when the one or more grooves are provided on the inside wall of the USB protection cover 20, the decorative part 30 further may be provided with the one or more raised lines adapted to the one or more grooves.

In the present embodiment, when the user does not use the USB data card, the one or more raised lines on the USB protection cover 10 and the first one or more grooves on the main body 10 together fix the USB protection cover 20 on the main body 10; when the user needs to use the USB data card, the USB protection cover 20 may be unplugged from the main body 10, then the USB protection cover 20 and the decorative part 30 are inserted in combination. For example, the one or more raised lines and the one or more second grooves are together fix the USB protection cover 20 on the decorative part 30 in a clamping manner.

Further, the decorative part 30 comprises an inserting combination portion inserted into the USB protection cover 20, and the size of the inserting combination portion is consistent with the size of the USB plug 101. In the present embodiment, the size of the inserting combination portion of the decorative part 30 is set to be consistent with the size of the USB plug 101, thereby facilitating inserting the decorative part 30 into the USB protection cover 20 and connecting to the USB protection cover 20 in a clamp-fixing manner.

In another embodiment, the difference from the above embodiments is that the USB protection cover 20 is in interference connection with the decorative part 30. In the present embodiment, since the USB protection cover 20 is set to be in interference fit connection with the decorative part 30, with respect to the above embodiments, when in processing the decorative part 30, there is no need to provide one or more grooves on the decorative part 30, thereby reducing the processing difficulty and being more suitable for industrial production.

In another embodiment, the difference from the above embodiments is that the USB protection cover 20 is in threaded connection with the decorative part 30. For example, an inner threaded structure may be provided in the inside wall of the USB protection cover 20, and an outer threaded structure adapted to the inner threaded structure may be provided on the outside wall of the decorative part 30. In the present embodiment, with respect to the above embodiments, by setting the threaded connection between the USB protection cover 20 and the decorative part 30, the fixing stability of the USB protection cover 20 is enhanced.

The descriptions above are only the preferable embodiment of the disclosure, which are not used to restrict the disclosure. Any equivalent replacements of the structure or the flow based on the contents of the specification and drawings of the disclosure, or direct or indirect application of the equivalent replacements in other related technical fields shall fall within the scope of protection of the disclosure.

What is claimed is:

1. A Universal Serial Bus, USB, data card, comprising a main body and a USB protection cover which is configured to protect a USB plug, wherein the main body is provided with a decorative part which is detachably connected with the USB protection cover, wherein the decorative part is provided with a sling, and the main body is provided with a through hole for the sling to pass, wherein the sling and the through hole together connect the decorative part with the main body.

2. The USB data card according to claim 1, wherein the USB protection cover is in buckle connection with the main body.

3. The USB data card according to claim 2, wherein an inside wall of the USB protection cover is provided with one or more raised lines, and one end of the main body which is near the USB plug is provided with one or more first grooves adapted to the one ore more raised lines, wherein the one or more raised lines and the one or more first grooves together fix the USB protection cover on the main body in a clamping manner.

4. The USB data card according to claim 1, wherein the USB protection cover is in buckle connection with the decorative part.

5. The USB data card according to claim 4, wherein a inside wall of the USB protection cover is provided with one or more raised lines, and the decorative part is provided with one or more second grooves adapted to the one or more raised lines, wherein the one or more raised lines and the one or more second grooves together fix the USB protection cover on the decorative part in a clamping manner.

6. The USB data card according to claim 5, wherein the decorative part comprises an inserting combination portion inserted into the USB protection cover, and the size of the inserting combination portion is consistent with the size of the USB plug.

7. The USB data card according to claim 1, wherein the USB protection cover is in interference fit connection with the decorative part.

8. The USB data card according to claim 1, wherein the USB protection cover is in threaded connection with the decorative part.

* * * * *